(12) United States Patent
Cerini et al.

(10) Patent No.: US 11,350,218 B2
(45) Date of Patent: May 31, 2022

(54) PIEZOELECTRIC MICROELECTROMECHANICAL ACOUSTIC TRANSDUCER HAVING IMPROVED CHARACTERISTICS AND CORRESPONDING MANUFACTURING PROCESS

(71) Applicant: STMICROELECTRONICS S.R.L., Agrate Brianza (IT)

(72) Inventors: Fabrizio Cerini, Magenta (IT); Silvia Adorno, Novate Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 195 days.

(21) Appl. No.: 16/882,343

(22) Filed: May 22, 2020

(65) Prior Publication Data

US 2020/0382876 A1 Dec. 3, 2020

(30) Foreign Application Priority Data

May 27, 2019 (IT) .......................... 102019000007317

(51) Int. Cl.
*H04R 17/02* (2006.01)
*H01L 41/113* (2006.01)
(Continued)

(52) U.S. Cl.
CPC ........... *H04R 17/02* (2013.01); *B81B 3/0021* (2013.01); *B81C 1/00158* (2013.01);
(Continued)

(58) Field of Classification Search
CPC .......... B81B 3/0021; B81B 2201/0257; B81C 1/00158; B81C 1/00166; B81C 1/00182;
(Continued)

(56) References Cited

U.S. PATENT DOCUMENTS 7,555,133 B2  6/2009  Hama
8,896,184 B2  11/2014  Grosh et al.
(Continued)

FOREIGN PATENT DOCUMENTS

CN     101941669 A     1/2011
CN     104254046 A     12/2014
(Continued)

*Primary Examiner* — Brian Ensey
(74) *Attorney, Agent, or Firm* — Seed IP Law Group LLP

(57) ABSTRACT

A piezoelectric microelectromechanical acoustic transducer, having a semiconductor substrate with a frame portion and a through cavity defined internally by the frame portion; an active membrane, suspended above the through cavity and anchored, at a peripheral portion thereof, to the frame portion of the substrate by an anchorage structure, a plurality of piezoelectric sensing elements carried by a front surface of the active membrane so as to detect mechanical stresses of the active membrane; a passive membrane, suspended above the through cavity, underneath the active membrane, interposed between the through cavity and a rear surface of the active membrane; and a pillar element, which fixedly couples, and is centrally interposed between, the active membrane and the passive membrane. A ventilation hole passes through the entire active membrane, the passive membrane and the pillar element to set the through cavity in fluidic communication with the front surface of the active membrane.

20 Claims, 8 Drawing Sheets

(51) Int. Cl.
  *B81B 3/00* (2006.01)
  *B81C 1/00* (2006.01)
  *H01L 41/09* (2006.01)

(52) U.S. Cl.
  CPC ...... *B81C 1/00166* (2013.01); *B81C 1/00182* (2013.01); *H01L 41/0926* (2013.01); *H01L 41/1132* (2013.01); *B81B 2201/0257* (2013.01); *H04R 2201/003* (2013.01)

(58) Field of Classification Search
  CPC ........... H04R 7/08; H04R 7/14; H04R 17/02; H04R 19/04; H04R 31/00; H04R 2201/003
  See application file for complete search history.

(56) References Cited

U.S. PATENT DOCUMENTS

| | | | |
|---|---|---|---|
| 8,958,595 B2 | 2/2015 | Hwang et al. | |
| 9,386,379 B2 | 7/2016 | Sparks et al. | |
| 10,034,097 B2 | 7/2018 | Clerici et al. | |
| 10,623,866 B2 | 4/2020 | Cerini et al. | |
| 2012/0270352 A1 | 10/2012 | Huffman et al. | |
| 2013/0223023 A1 | 8/2013 | Dehe et al. | |
| 2014/0084395 A1 | 3/2014 | Sparks et al. | |
| 2015/0001647 A1* | 1/2015 | Dehe | B81B 3/0021 257/416 |
| 2017/0325030 A1* | 11/2017 | Stoppel | H04R 17/00 |
| 2018/0234783 A1 | 8/2018 | Clerici et al. | |
| 2019/0082268 A1 | 3/2019 | Yoo | |
| 2019/0297427 A1* | 9/2019 | Zou | H04R 17/02 |

FOREIGN PATENT DOCUMENTS

| | | |
|---|---|---|
| CN | 104418291 A | 3/2015 |
| CN | 108769881 A | 11/2018 |
| CN | 109525928 A | 3/2019 |
| CN | 109565634 A | 4/2019 |
| JP | 2018-137297 A | 8/2018 |
| WO | 2019/081220 A1 | 5/2019 |

* cited by examiner

PIEZOELECTRIC MICROELECTROMECHANICAL ACOUSTIC TRANSDUCER HAVING IMPROVED CHARACTERISTICS AND CORRESPONDING MANUFACTURING PROCESS

BACKGROUND

Technical Field

The present solution relates to a piezoelectric microelectromechanical acoustic transducer, made with MEMS (Micro-Electro-Mechanical System) technology, and to a corresponding manufacturing process; in particular, reference will be made hereinafter to a MEMS transducer operating as a microphone, for detecting acoustic pressure or sound waves.

Description of the Related Art

As is known, MEMS techniques for manufacturing semiconductor devices enable provision of microelectromechanical structures within layers of semiconductor material, deposited (for example, a layer of polycrystalline silicon) or grown (for example, an epitaxial layer) on sacrificial layers, which are at least in part removed via chemical etching.

In particular, MEMS electroacoustic transducers (microphones) are known, comprising a flexible membrane integrated in a die of semiconductor material, anchored to a substrate and appropriately suspended above a cavity. The membrane is exposed to acoustic waves (i.e., perturbations superimposed on the atmospheric pressure) and is subjected to mechanical stresses as a result of the force exerted by the acoustic waves.

The resulting deformation of the membrane can be measured using various measurement techniques.

For instance, the capacitive measurement technique envisages capacitively coupling the membrane to a different conductive region, which faces the membrane, of the die so as to form the electrodes of a sensing capacitor; the piezoelectric measurement technique envisages detection of the mechanical stress (i.e., conversion of the mechanical stress into electrical charge) to which the membrane is subjected by integration of appropriate piezoelectric elements in, or on, the membrane. In either case, the variation of an electric current signal resulting from deformation or mechanical stress of the membrane is measured.

MEMS microphones of a capacitive type are extensively used in a wide range of electronic devices, in particular of a mobile type, such as smartphones, tablets and the like.

However, MEMS capacitive microphones have some disadvantages. In particular, these microphones may have problems of reliability due to contamination by particles from outside and/or other contaminants (for example, liquids or dust). Particles from outside may remain trapped between the electrodes (in general, between the mobile part and the fixed part) of the sensing capacitor, acting as mechanical blocks in regard to deformation of the membrane and moreover generating electrical leakage paths, causing malfunctioning and a reduction in performance of the MEMS microphone. Moreover, the presence of contaminants between the electrodes of the sensing capacitor may cause permanent damage to the microphone.

MEMS microphones of a piezoelectric type in general allow to overcome these limitations, being able to operate also when immersed in fluids other than air (for example, water and non-conductive liquids) and not being affected by malfunctioning and/or reductions in performance caused by contaminants and particles (given that their operation is not based on the presence of two facing electrodes).

In particular, in MEMS microphones of a piezoelectric type, sensitive regions of piezoelectric material, such as, for example, AlN (aluminum nitride) or PZT (lead zirconate titanate), are formed on the membrane, preferably in the proximity of the areas where there is a maximum concentration of mechanical stress. In the presence of acoustic waves that cause stress/displacement of the membrane, the sensitive regions, subjected to stress, give rise to a variation of an electrical detection signal (typically a current signal) related to the intensity of the acoustic waves detected. An electronic interface circuit, typically in the form of an ASIC (Application-Specific Integrated Circuit) electrically coupled to the MEMS microphone processes and amplifies the electrical detection signal and supplies at the output an analog or digital signal that can then be processed by a control unit of the electronic device in which the microphone is used.

An example of MEMS microphone of a piezoelectric type is described in U.S. Pat. No. 8,896,184 and is illustrated schematically in FIG. 1 (which represents in particular a portion of the electromechanical structure of the aforesaid MEMS microphone).

The MEMS microphone, designated by 1, comprises a silicon substrate 2, having a cavity 3; a pair of cantilever beams 4a, 4b, one being a prolongation of the other, extend above the cavity 3 in cantilever fashion. The beams 4a, 4b are anchored to the substrate 2 at a respective first end and define between them, at a respective second end, a ventilation opening 6, for the acoustic waves to be detected.

Each beam 4a, 4b is formed by a stack of layers, for example, constituted by a plurality of piezoelectric layers 7 (e.g., aluminum-nitride layers), alternating with a plurality of electrode layers 8 (e.g., molybdenum layers); a dielectric layer 9 electrically insulates the beams 4a, 4b from the substrate 2.

During operation, the aforesaid piezoelectric and electrode layers 7, 8 enable detection of the mechanical stresses to which the beams 4a, 4b are subject as a result of the incident acoustic waves.

The present Applicant has realized that this known solution, however, has some disadvantages.

In particular, the geometry of the ventilation hole 6 of the MEMS microphone 1 depends on the undesired non-zero initial deflection of the beams 4a, 4b, due to the equivalent residual stress of the layers of material present on each beam 4a, 4b.

The variation in the dimensions of the ventilation hole 6 leads to a less precise control of the frequency, the so-called "roll-off" frequency (which determines, in a known way, the low-frequency behavior of the MEMS microphone 1, in particular the so-called "−3 dB cut-off point" of the sensitivity). This behavior is undesirable since the roll-off frequency may in this case have uncontrolled variations of even up to ±50 Hz, such a variation being incompatible with current market demands that, in many cases, envisage a maximum variation of the roll-off frequency of ±5-10 Hz.

MEMS microphones of a piezoelectric type currently available on the market moreover have a reduced sensitivity and, therefore, a reduced signal-to-noise ratio (SNR).

BRIEF SUMMARY

An aim of the present solution is to provide a piezoelectric microelectromechanical acoustic transducer allowing to overcome or lessen one or more of the drawbacks of the prior art.

According to the present solution, an acoustic transducer and a corresponding manufacturing process are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
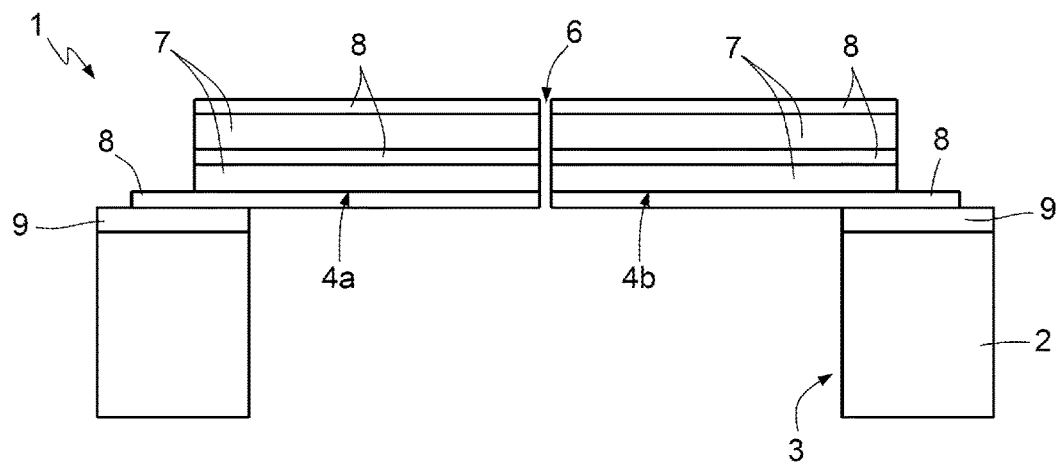
FIG. 1 is a schematic sectional view of a piezoelectric MEMS acoustic transducer of a known type.
Figure 2:
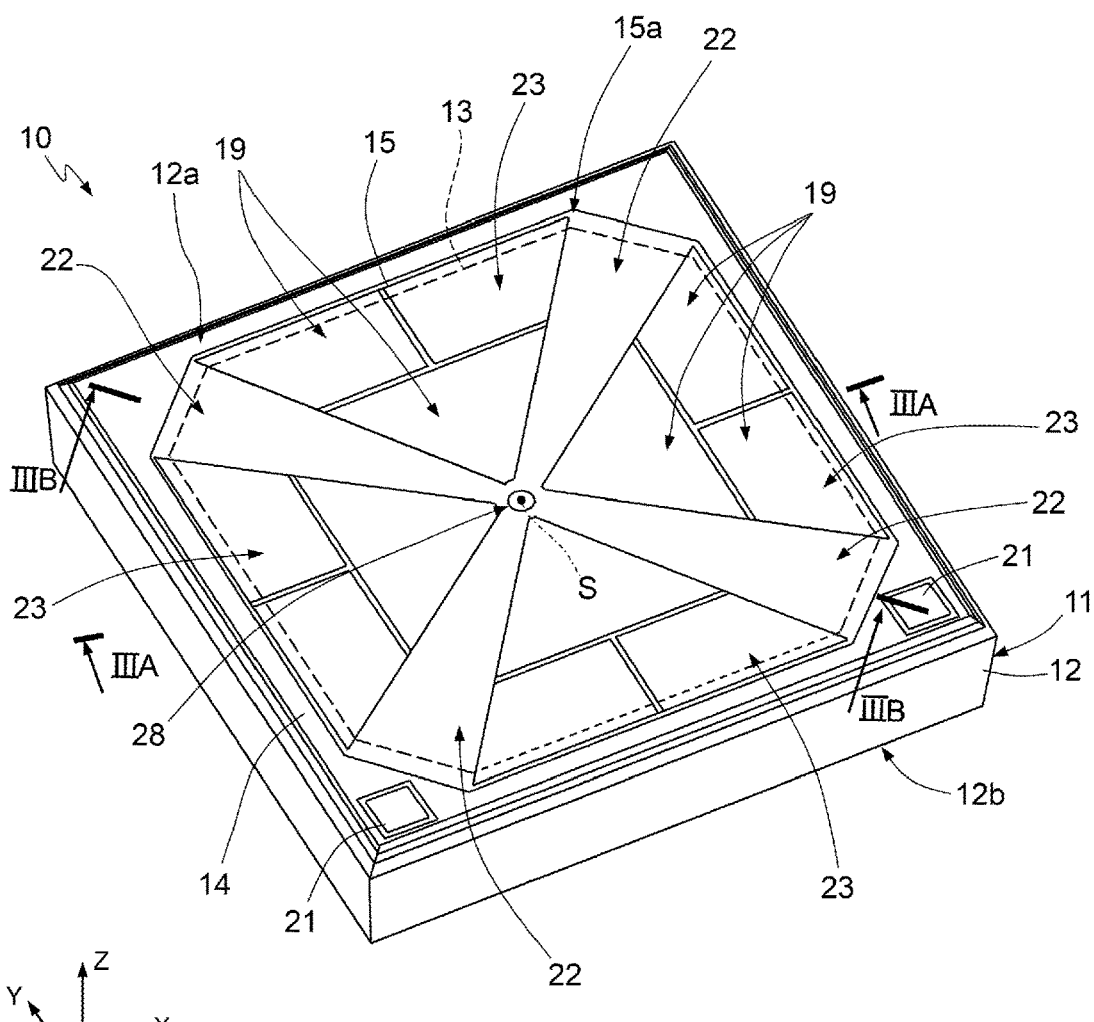
FIG. 2 is a schematic perspective top view, with parts removed for greater clarity, of a piezoelectric MEMS acoustic transducer, according to an embodiment of the present solution.
Figure 3A:
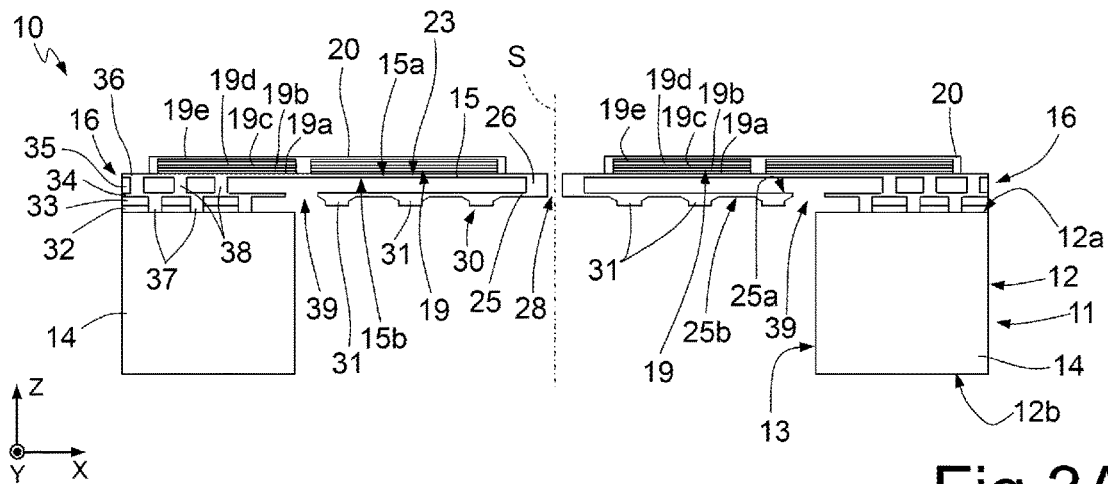
FIG. 3A is a first cross-sectional view taken along the line of section IIIA-IIIA of the MEMS acoustic transducer of FIG. 2.
Figure 3B:
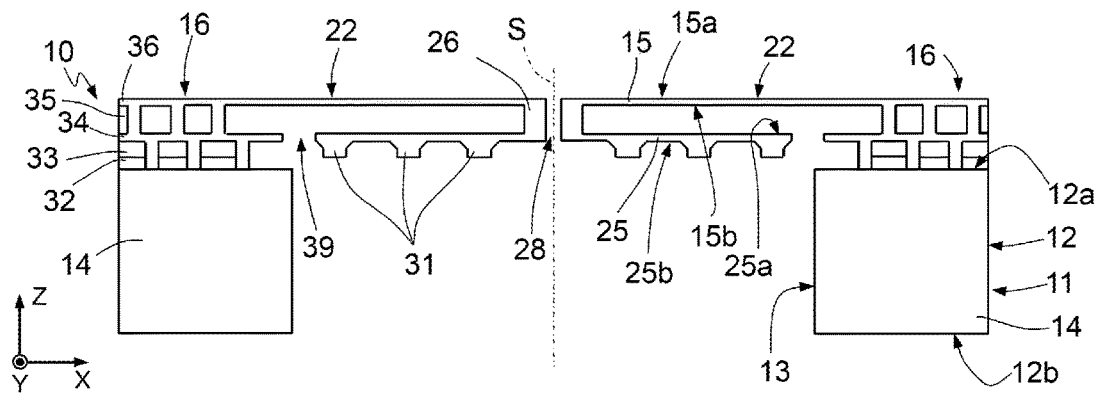
FIG. 3B is a second cross-sectional view taken along the line of section IIIB-IIIB of the MEMS acoustic transducer of FIG. 2.

With reference to FIGS. 2 and 3A-3B, an embodiment of a MEMS acoustic transducer of a piezoelectric type (in particular a microphone) according to the present solution, designated as a whole by 10, is now described.

The MEMS transducer 10 is formed in a body 11 of semiconductor material, such as monocrystalline silicon, comprising a substrate 12 with a front surface 12a and a rear surface 12b, which have a main extension in a horizontal plane xy and are opposite to one another along a vertical axis z, orthogonal to the aforesaid horizontal plane xy. For instance, the substrate 12 has, in top view (FIG. 2), a generically quadrangular shape, for example, square or rectangular, with a central axis S (median axis or axis of symmetry).

The substrate 12 is entirely traversed, from the rear surface 12b to the front surface 12a, by a through cavity 13 having, in top view, a shape that is, for example, circular, quadrangular or generically polygonal; the substrate 12 defines a frame 14 that externally delimits the aforesaid through cavity 13.

The MEMS transducer 10 further comprises an active membrane 15, suspended above the front surface 12a of the substrate and the through cavity 13, having a peripheral portion fully clamped to the substrate 12, by means of an anchorage structure 16.

The active membrane 15 has a main extension in the horizontal plane xy and a much smaller dimension along the vertical axis z (in other words, the active membrane 15 is very thin), with a shape in top view that is generically quadrangular (as in the example represented), polygonal or circular.

The aforesaid anchorage structure 16 is coupled along the entire peripheral portion of the active membrane 15 and is interposed between the active membrane 15, in particular between a rear surface 15b of the same active membrane 15 and the front surface 12a of the substrate 12, at the frame 14, surrounding the through cavity 13 like a ring.

As will be discussed in greater detail hereinafter, the anchorage structure 16 is formed by overlapping of a plurality of layers on top of one another, of different dielectric and conductive materials; in particular, a top layer of the anchorage structure 16 of conductive material (for example, polysilicon) is formed (as will be discussed hereinafter, during the corresponding step of the manufacturing process) integral to the aforesaid active membrane 15, in effect constituting a side prolongation thereof, whereas a bottom layer, of dielectric material, for example, USG (Undoped Silicate Glass), silicon oxide obtained by thermal oxidation ($SiO_2$), or TEOS (TetraEthylOrthoSilicate), is formed on the front surface 12a of the substrate 12.

A plurality of piezoelectric sensing elements 19 are arranged on the front surface 15a of the active membrane 15, defining respective sensing cells (for conversion between stress and electrical charge) formed by stacked regions of conductive material and piezoelectric material.

In the example represented, each sensing cell is of a bimorphic type, comprising, that is, a stack constituted by: a first electrode region 19a (bottom electrode), arranged on the front surface 15a of the active membrane 15; a first region of piezoelectric material 19b, arranged on the first electrode region 19a; a second electrode region 19c (intermediate electrode), arranged on the first region of piezoelectric material 19b; a second region of piezoelectric material 19d, arranged on the second electrode region 19c; and a third electrode region 19e (top electrode), arranged on the second region of piezoelectric material 19d (alternatively, in a way not illustrated herein, each sensing cell may be of a unimorphic type, i.e., only comprising the bottom and top electrode regions with a single region of piezoelectric material set in between).

For instance, the electrode regions may be of molybdenum (Mo), doped polysilicon, titanium (Ti), or platinum (Pt); whereas the regions of piezoelectric material may be of aluminum nitride (AlN).

A passivation region 20 (for example, of silicon nitride, $Si_3N_4$, silicon carbide, SiC, or aluminum nitride, AlN) is arranged on the piezoelectric sensing elements 19 and between the same piezoelectric sensing elements 19. Appropriate electrical connections between the electrode regions of the piezoelectric sensing elements 19 are implemented, as will be discussed in detail hereinafter, by conductive paths (here not illustrated, for example, of a titanium-tungsten and gold alloy, TiW/Au, aluminum, Al, or of an aluminum and copper alloy, AlCu), which are provided on and through the passivation region 20 (which has, in a way not illustrated, a plurality of contact openings, extending within which are portions of the aforesaid conductive paths to enable electrical contact with the aforesaid electrode regions).

The aforesaid conductive paths, as well as further electrical-contact regions (also not illustrated), moreover enable electrical coupling of the piezoelectric sensing elements 19 to external circuits and processing devices, through appropriate contact pads, designated as a whole by 21 in FIG. 2.

As illustrated once again in FIG. 2, only part of the front surface 15a of the active membrane 15 is overlaid by the aforesaid piezoelectric sensing elements 19; there are, in fact, exposed regions 22 of the front surface 15a, on which piezoelectric sensing elements 19 are not present.

In the example illustrated, these exposed regions 22 extend in the form of crosses starting from the center, diagonally towards respective corner portions of the active membrane 15, defining between them covered regions 23, which are overlaid, instead, by the aforesaid piezoelectric sensing elements 19, and have a generically triangular shape in plan view. In the same example illustrated, three piezoelectric sensing elements 19 or sensing cells are arranged in each of these covered regions 23 (which are four in number), one at the vertex of the aforesaid triangle (and at a central and internal portion of the active membrane 15) and two, arranged side-by-side, at the base of the same triangle (and at the peripheral portion of the active membrane 15).

As will be highlighted also hereinafter, the geometrical definition of the aforesaid exposed areas 22 and covered areas 23, as well as the definition of the number, and the conformation of the piezoelectric sensing elements 19, depend on the desired characteristics of stiffness of the active membrane 15 and on the desired performance of detection of the acoustic waves (for example, in terms of signal-to-noise ratio and sensitivity).

According to a particular aspect of the present solution (see, in particular, FIGS. 3A and 3B), the MEMS transducer 10 further comprises a passive membrane 25 suspended above the through cavity 13 and underneath the active membrane 15 (in other words, the passive membrane 25 faces the rear surface 15b of the active membrane 15 and is interposed between the same active membrane 15 and the through cavity 13).

The passive membrane 25 is concentric and internal to the through cavity 13 and its extension in the horizontal plane xy is smaller than the corresponding extension of the through cavity 13 (and of the overlying active membrane 15). Also the passive membrane 25 is thin but rigid (thanks to a reinforcement structure 30), having a main extension in the horizontal plane xy and a much smaller dimension along the vertical axis z; the passive membrane 25 can have a shape in the horizontal plane xy that is substantially quadrangular (as in the example represented), polygonal or circular.

The passive membrane 25 is fixedly coupled to the active membrane 15 by a pillar element 26, arranged at the center, at the central axis S, interposed between the rear surface 15b of the active membrane 15 and a facing surface the passive membrane 25 (in particular, a front surface 25a of the passive membrane 25, opposite to a corresponding rear surface 25b, the latter in turn facing the through cavity 13).

In a possible embodiment, the active membrane 15, the passive membrane 25, and the pillar element 26 are of semiconductor material, in particular (undoped) polysilicon.

According to an aspect of the present solution, a through hole 28 passes through the whole active membrane 15, the pillar element 26 and the passive membrane 25, defining a path for the air from the rear surface 25b of the same passive membrane 25 (and from the through cavity 13) to the front surface 15a of the active membrane 15.

In particular, the aforesaid through hole 28 extends vertically (along the vertical axis z) at the center, at the central axis S and traversed by the same central axis S; this through hole 28 has, for example, a circular shape in plan view (or a quadrangular or generically polygonal shape), with a diameter, for example, comprised between 5 and 30 µm.

The through hole 28 constitutes the ventilation hole of the MEMS transducer 10 and, as discussed previously, its dimensions and configuration determine the low-frequency characteristics (in particular the roll-off point) of the MEMS transducer 10.

In this embodiment, the roll-off is independent of the initial position of the active and passive membranes 15, 25 (defined by the residual stresses) and of their displacement (defined by the acoustic pressure on the passive membrane 25).

In the embodiment illustrated, the passive membrane 25 carries, at its rear surface 25b, a reinforcement structure 30, so-called "stiffener", formed integrally with the same passive membrane 25 (being, in the example discussed, also of semiconductor material, in particular polysilicon).

Figure 4:
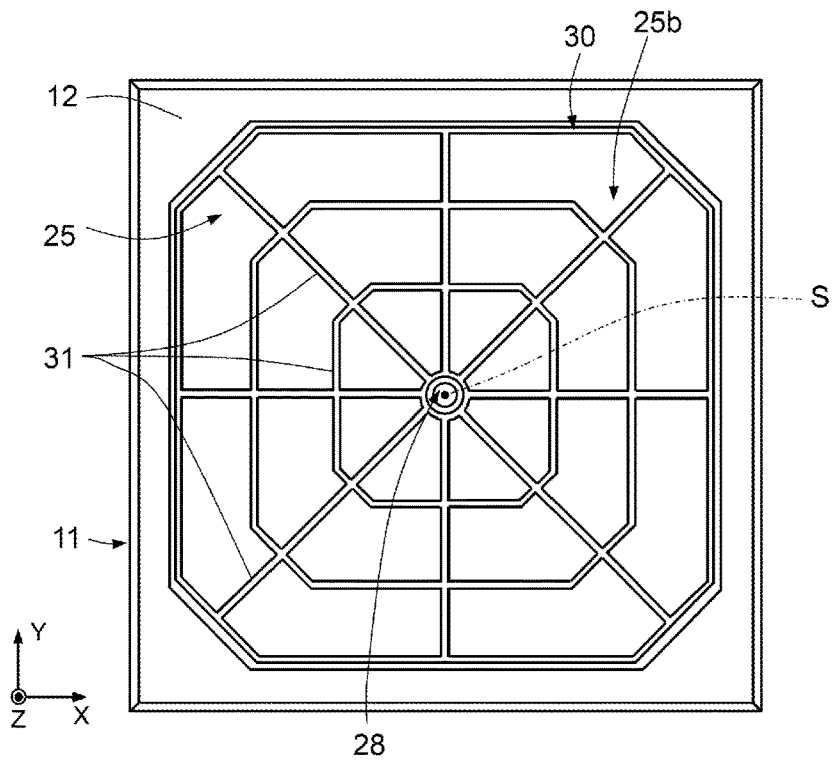
FIG. 4 is a schematic view from beneath, with parts removed for greater clarity, of a passive membrane of the MEMS acoustic transducer of FIG. 2.

The reinforcement structure 30, as illustrated schematically also in FIG. 4 (which is a view from beneath of the passive membrane 25), is as a whole shaped, for example, like a web, and has a plurality of projecting portions 31, coupled to the rear surface 25b of the passive membrane 25 and extending as protuberances towards the through cavity 13.

In particular, the reinforcement structure 30 has the function of increasing the stiffness of the passive membrane 25, without adding further and significant mass contributions to the same passive membrane 25. In this way, it is possible to have a very thin passive membrane 25 (for example, with a thickness of 0.3 µm) with a high stiffness (being substantially undeformable).

In greater detail, the aforesaid anchorage structure 16 (illustrated in FIGS. 3A and 3B) comprises: a first dielectric region 32 for example, of silicon oxide, arranged on the front surface 12a of the substrate 12, at the frame 14; a second dielectric region 33 for example, of USG, arranged on the first dielectric region 32; a first structural region 34, overlying the second dielectric region 33; a third dielectric region 35, overlying the first structural region 34; a second structural region 36, overlying the third dielectric region 35; and a plurality of first anchorage elements 37 and second anchorage elements 38.

In particular, the first structural region 34 is, for example, of polysilicon and has the same thickness and characteristics as the passive membrane 25, being obtained simultaneously therewith, as described in detail hereinafter. The third dielectric region 35 defines the distance between the passive membrane 25 and the active membrane 15 and, therefore, the height (measured along the vertical axis z) of the pillar element 26. The second structural region 36 is, for example, of polysilicon and has the same thickness and characteristics as the active membrane 15, being obtained simultaneously therewith, as will be described in detail hereinafter.

The first anchorage elements 37 extend through the first and the second dielectric regions 32, 33 between the substrate 12 and the first structural region 34. The first anchorage elements 37 therefore have a thickness equal to the joint thickness of the aforesaid first and second dielectric regions 32, 33 (measured along the vertical axis z). The second anchorage elements 38 extend through the third dielectric region 35, between the first and the second structural regions 34, 36, and, therefore, have the same thickness as the aforesaid third dielectric region 35.

In the embodiment illustrated, the passive membrane 25 is laterally delimited by an opening 39, which separates it from the first structural region 34 of the aforesaid anchorage structure 16; it should be noted that this opening 39 does not represent, however, a ventilation opening, giving in fact access to a space closed in regard to the outside of the MEMS transducer 10, delimited at the top and at the bottom, respectively, by the active membrane 15 and by the passive membrane 25 (in other words, this opening 39 does not set the through cavity 13 in communication with the front surface 15a of the active membrane 15, unlike the through hole 28, described previously).

In use, acoustic pressure waves, coming from outside and traversing the through cavity 13, act on the passive membrane 25, impressing thereon a force that displaces the same passive membrane 25 along the vertical axis z, without deforming it (thanks, in particular, to the presence of the reinforcement structure 30, which suitably increases the stiffness thereof); the force impressed by the acoustic pressure waves on the passive membrane 25 is then transmitted, concentrated at the central axis S, from the pillar element 26 to the active membrane 15, maximizing the stress thereof at the peripheral portion, constrained to the substrate 12 by means of the anchorage structure 16.

In other words, the passive membrane 25, the pillar element 26, and the central portion of the active membrane 15 move according to a piston-like movement of translation as a result of the force impressed by the external acoustic pressure, and the mechanical stress acting on the active membrane 15, in particular in a corresponding peripheral portion, is maximized by a lever-arm effect, consequently causing a concentration of stress and, therefore, a maximum stress (in absolute value) at the anchorages of the active membrane 15. In this way, the sensitivity and, consequently, the signal-to-noise ratio (SNR) of the MEMS transducer 10 is advantageously maximized.

The stress is appropriately detected by the piezoelectric sensing elements 19 by the corresponding regions of piezoelectric material, causing generation of the electrical detection signal, which can then be transmitted to external circuits and processing devices.

In particular, during the piston-like movement of the active membrane 15, of the pillar element 26 and of the central portion of the active membrane 15 there is no modification of the dimensions and geometrical characteristics of the ventilation hole of the MEMS transducer 10 (constituted by the through hole 28); the roll-off characteristics of the MEMS transducer 10 can consequently be controlled in an extremely precise way (being, in fact, determined only by the manufacturing process used for formation of the aforesaid through hole 28, as will be discussed hereinafter, and being independent of the operating mode).

Figure 5A:
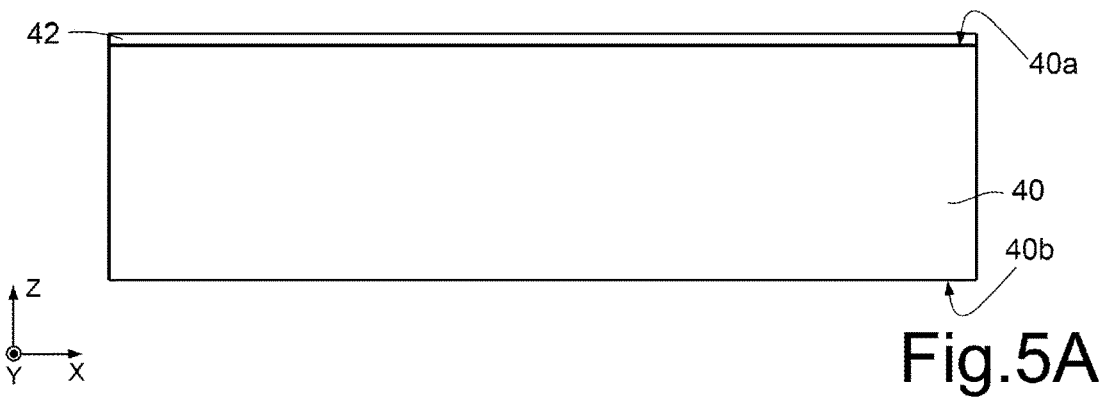
FIGS. 5A-5K are cross-sectional views of the MEMS transducer of FIG. 2 in successive steps of a corresponding manufacturing process.

With initial reference to FIG. 5A, a possible manufacturing process used for manufacturing the MEMS transducer 10 is now described.

In particular, FIG. 5A shows a portion of a wafer 40 of semiconductor material, for example silicon, where the MEMS transducer 10 will be obtained. The wafer 40 has a front surface 40a and a rear surface 40b; on the front surface 40a, according to known deposition techniques, a first dielectric layer 42 has been already deposited, for example, of silicon oxide and having a thickness comprised, e.g., between 0.5 µm and 2.6 µm, being also designed to form the first dielectric regions 32 of the anchorage structure 16 (as will be discussed hereinafter).

Figure 5B:
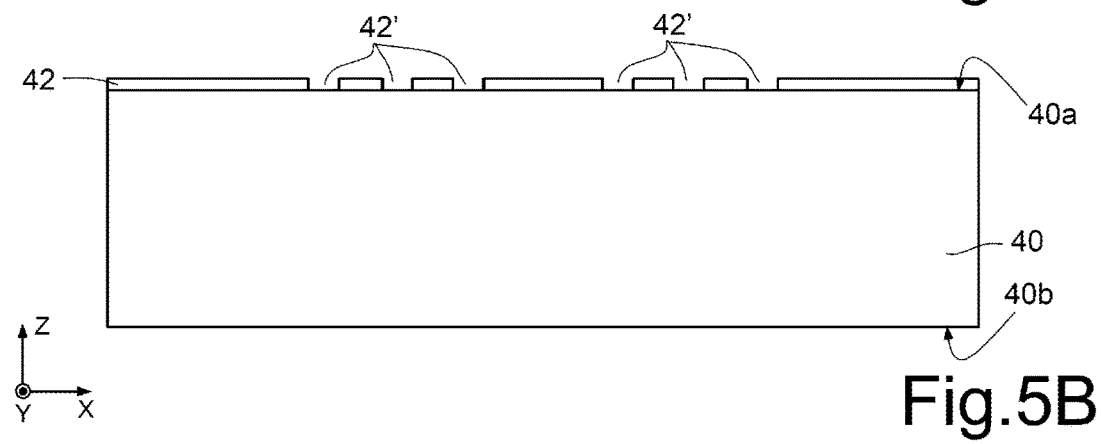

As shown in FIG. 5B, the first dielectric layer 42 is defined according to known masking and definition techniques so as to form a plurality of first reinforcement-definition openings 42'.

Figure 5C:
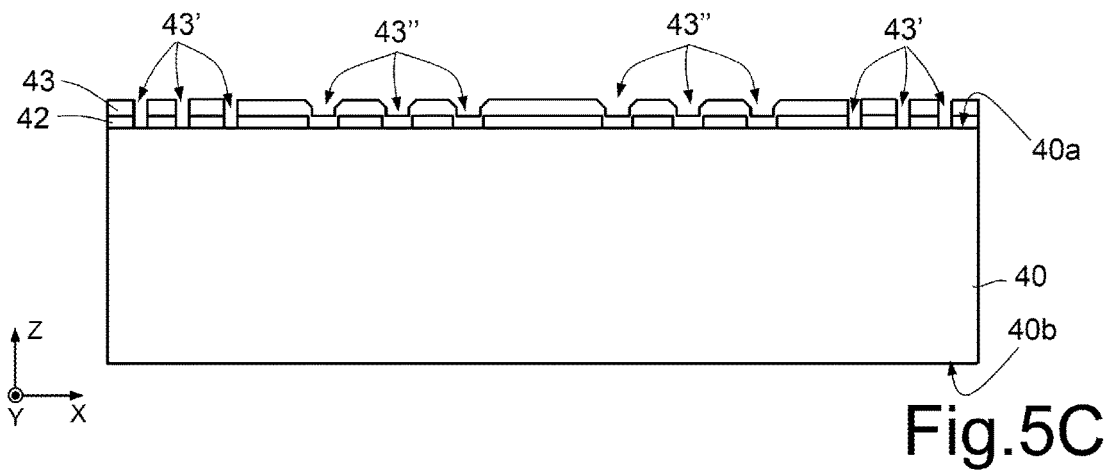

As shown in FIG. 5C, on the first dielectric layer 42 a second dielectric layer 43, for example of USG, is then deposited, in a conformable manner according to known techniques, which is also designed to form the second dielectric regions 33 of the anchorage structure 16; it should be noted that the second dielectric layer 43 fills the aforesaid first reinforcement-definition openings 42' defining, however, given the conformable deposition, corresponding second reinforcement-definition openings 43".

The second dielectric layer 43 is then defined according to known masking and definition techniques, so as to form a plurality of first anchorage openings 43', which moreover traverse the first dielectric layer 42 in a position corresponding to what will be the anchorage structure 16.

Figure 5D:
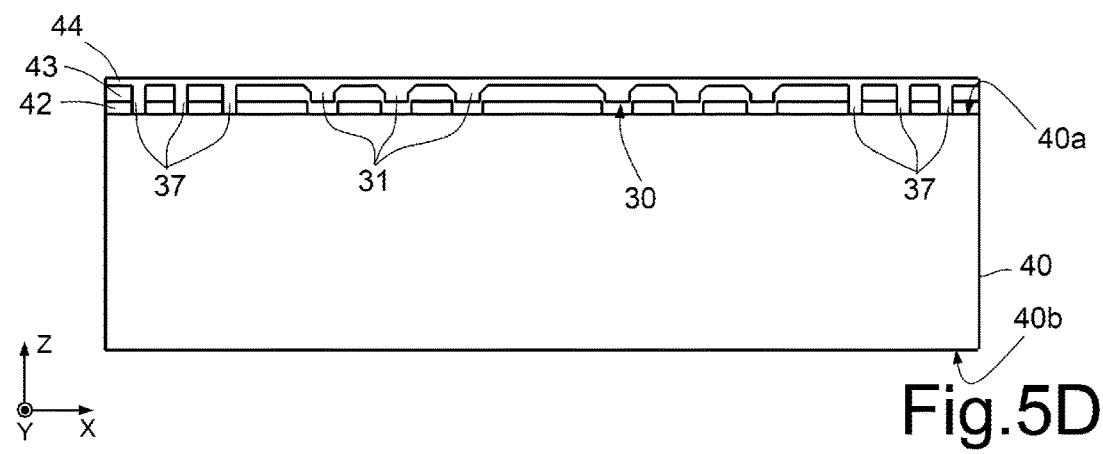

As shown in FIG. 5D, on the second dielectric layer 43 a first layer 44 is then deposited or grown with known techniques, which is designed to form the passive membrane 25 and the first structural regions 34 of the anchorage structure 16. The aforesaid first layer 44 is, for example, of undoped polysilicon, has a thickness comprised, for example, between 1 µm and 2 µm, and fills the plurality of first anchorage openings 43', thus forming the first anchorage elements 37, and moreover the second reinforcement-definition openings 43", thus forming the reinforcement structure 30 and the corresponding projecting portions 31 coupled to what will be the passive membrane 25.

Figure 5E:
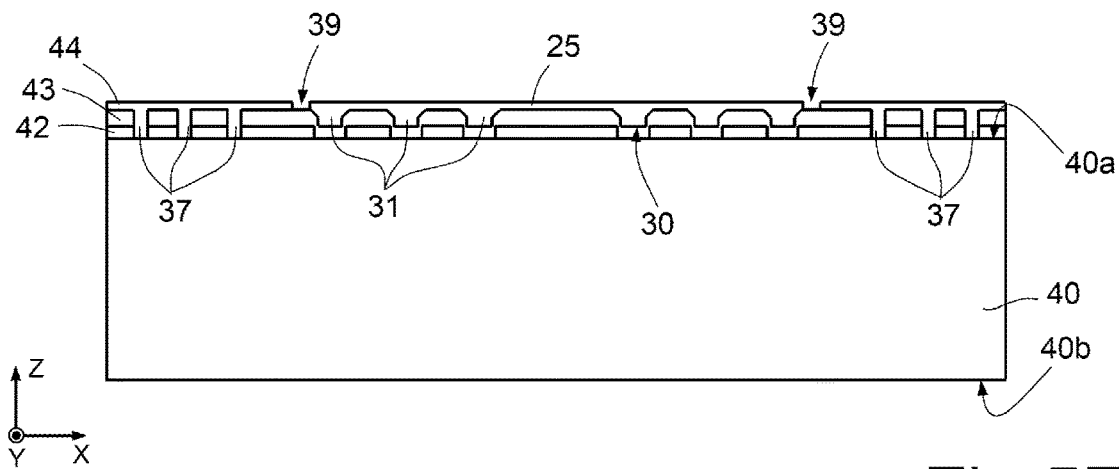

As shown in FIG. 5E, the first layer 44 is defined according to known photolithographic techniques so as to define the geometry of the passive membrane 25, forming in particular the opening 39, which laterally delimits the passive membrane 25.

Figure 5F:
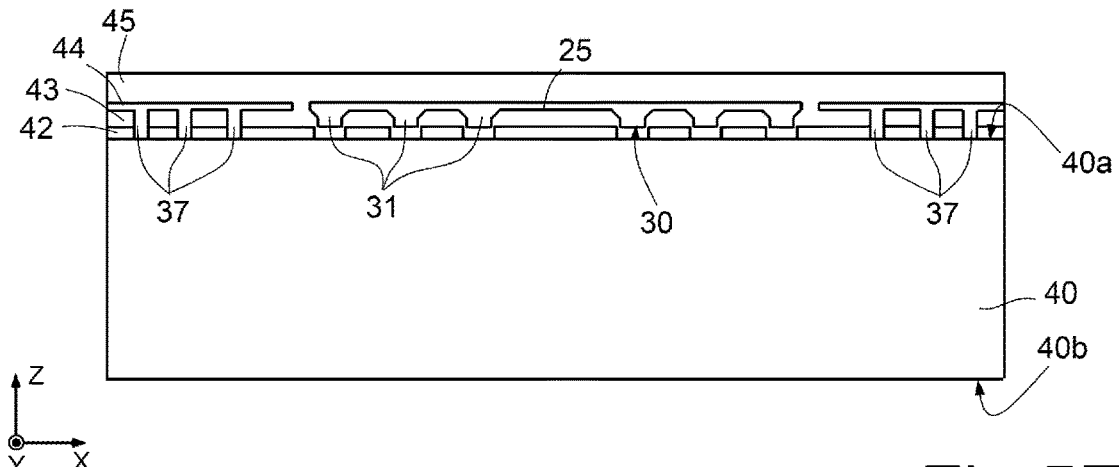

As shown in FIG. 5F, a third dielectric layer 45 is then deposited on the first layer 44; in particular, this third dielectric layer 45, which is also designed to form the third dielectric regions 35 of the anchorage structure 16, is, for example, of silicon oxide, with a thickness comprised, for example, between 1 µm and 4 µm.

Figure 5G:
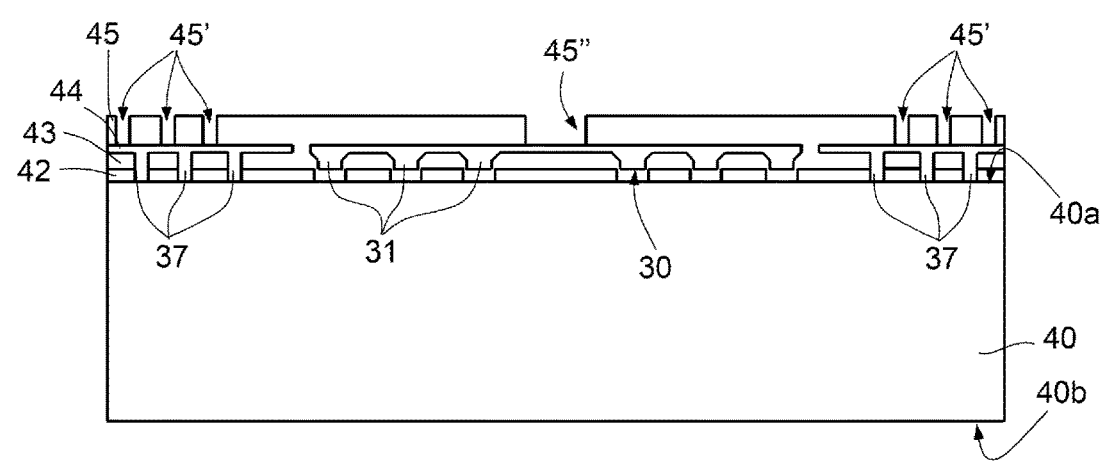

As shown in FIG. 5G, the third dielectric layer 45 is defined using known photolithographic techniques, so as to form a plurality of second anchorage openings 45', arranged in peripheral areas of the third dielectric layer 45, in a position corresponding to what will be the anchorage structure 16, and moreover a pillar opening 45", arranged in a central portion of the third dielectric layer 45, where the pillar element 26 will be formed.

Figure 5H:
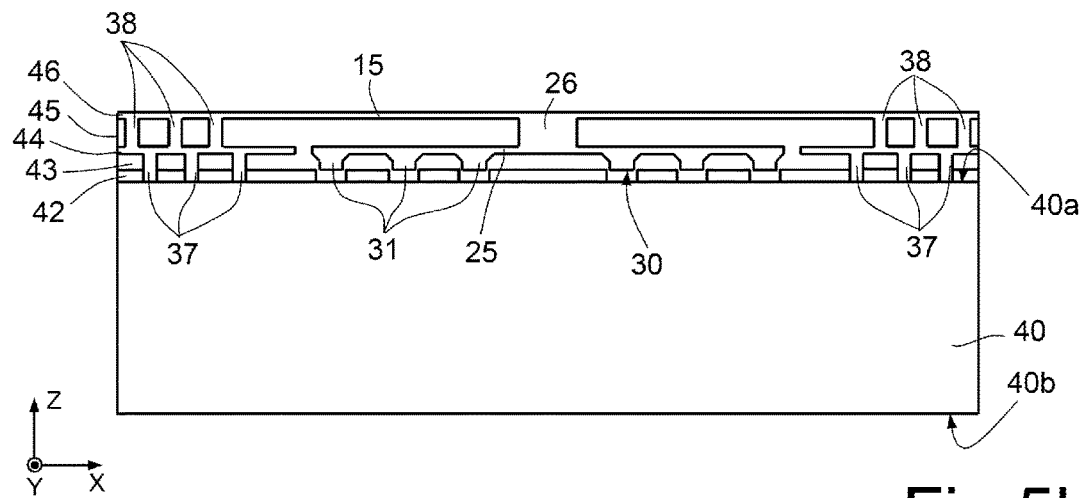

As shown in FIG. 5H, on the third dielectric layer 45 a second layer 46 is deposited, for example, of polysilicon with a thickness comprised between 0.5 µm and 3 µm, which is to form the active membrane 15 and the second structural regions 36 of the anchorage structure 16. In detail, the second layer 46 fills the plurality of second anchorage openings 45', to form the second anchorage elements 38, and moreover the pillar opening 45", to form the aforesaid pillar element 26, which moreover fixedly couples the active membrane 15 and the passive membrane 25.

As shown in Figure SI, the piezoelectric sensing elements 19 are formed on the active membrane 15 (which has a thickness comprised, for example, between 0.5 µm and 1.5 µm). In particular, in a per se known manner, a bottom electrode layer, a first piezoelectric layer, an intermediate electrode layer, a second piezoelectric layer and a top electrode layer (in the case of a bimorphic structure) are deposited in sequence on the active membrane 15. Then, the stack of layers thus formed is defined in a per se known manner (for example, using photolithographic techniques) so as to define, for each sensing cell, the corresponding stack formed by the first electrode region 19a, the first region of piezoelectric material 19b, the second electrode region 19c, the second region of piezoelectric material 19d, and the third electrode region 19e. Next, on the piezoelectric sensing elements 19 a passivation layer 49 (which may once again be aluminum nitride, AlN, or a passivating oxide or silicon nitride) is deposited, which is defined in a per se known manner, to form the passivation region 20. In a way not illustrated herein, a metallization layer is moreover deposited and defined on the aforesaid passivation layer 49 so as to form the paths of conductive material for electrical contact with the aforesaid electrode regions of the piezoelectric sensing elements 19.

Figure 5I:
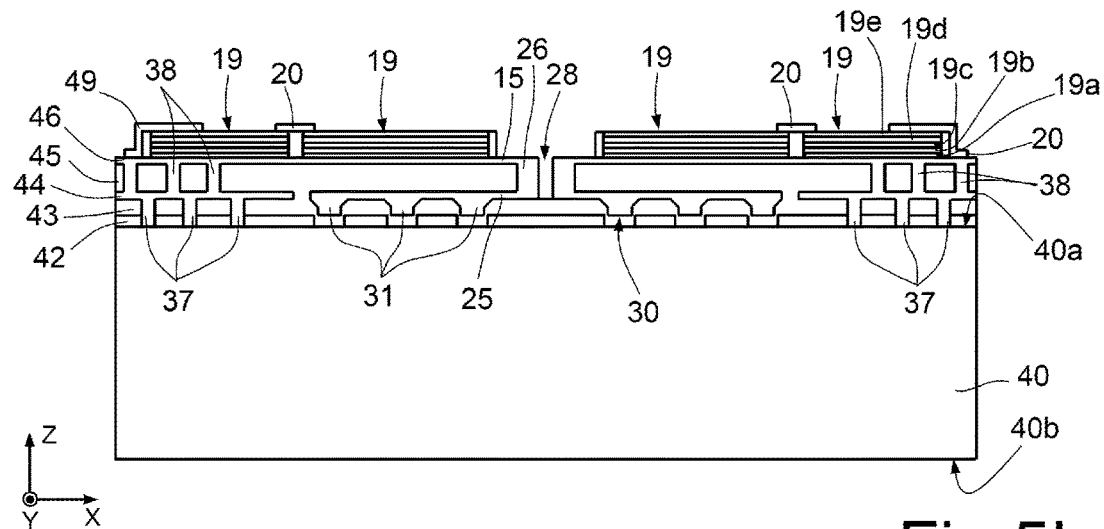

As shown in FIG. 5I, the second layer 46 is etched, via an appropriate mask and photolithographic technique, so as to open, centrally with respect to the pillar element 26, the through hole 28, which traverses the entire thickness of the active membrane 15, the same pillar element 26 and the passive membrane 25 (terminating at the underlying second dielectric layer 43); as discussed previously, the aforesaid through hole 28 is designed to define the ventilation hole of the MEMS transducer 10 and, therefore, the sensor low-frequency behavior. Advantageously, the photolithographic definition techniques used for opening the through hole 28 enable an extremely precise definition of its geometrical and dimensional characteristics.

Figure 5J:
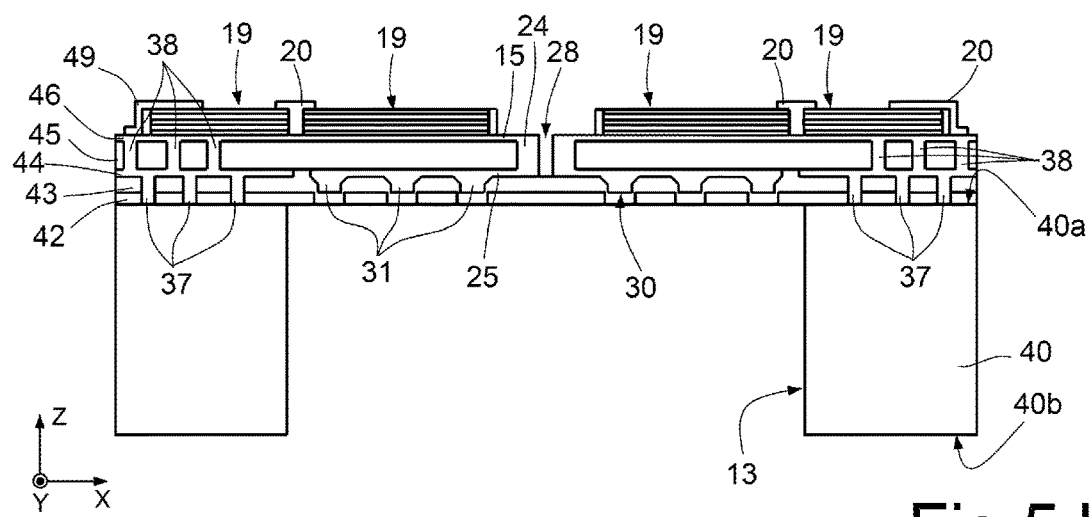

As shown in FIG. 5J, the wafer 40 is etched starting from the rear surface 40b according to known etching techniques (for example, with dry etching such as DRIE—Deep Reactive Ion Etching); in particular, etching proceeds until reaching the first dielectric layer 42, which acts as etch-stop layer, and leads to formation of the through cavity 13.

Figure 5K:
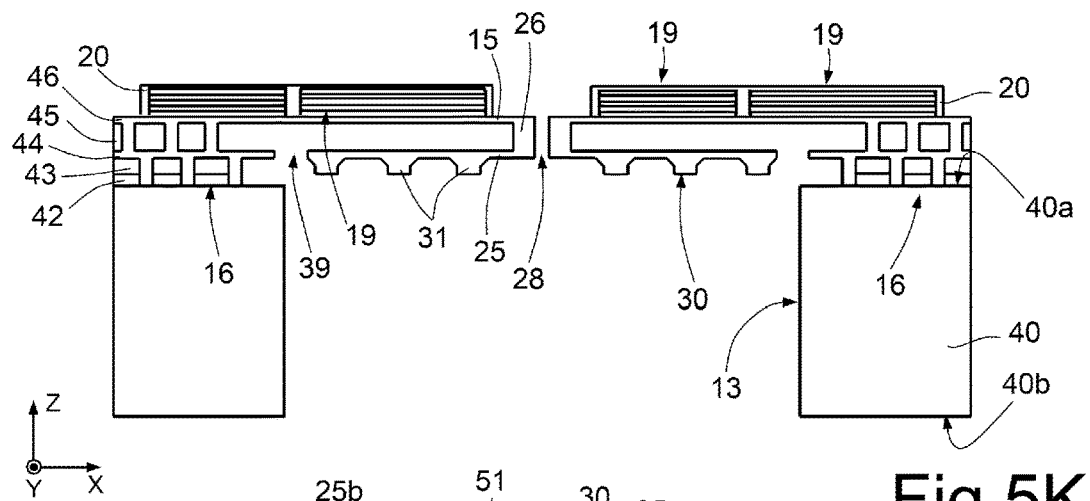

Next, as shown in FIG. 5K, a wet-etching or vapor-etching step is carried out (for example, using hydrofluoric acid, HF) so as to remove the portions of the first and the second dielectric layers 42, 43 facing the through cavity 13 and moreover the portions of the third dielectric layer 45 interposed between the passive membrane 25 and the active membrane 15 (these portions consequently having the nature of sacrificial regions), so as to obtain release of the passive membrane 25 and of the active membrane 15, which are suspended above the through cavity 13. Upon removal of the sacrificial layer, the anchorage structures 16, for anchorage of the active membrane 15, are moreover defined.

This is followed by a step of dicing of the wafer 40, which leads to obtaining a plurality of MEMS transducers 10, starting from the same wafer 40, each in a corresponding body (or die) 11 of semiconductor material and in the corresponding substrate 12, having the structure described in detail with reference to the aforesaid FIGS. 2 and 3A-3B.

Figure 6A:
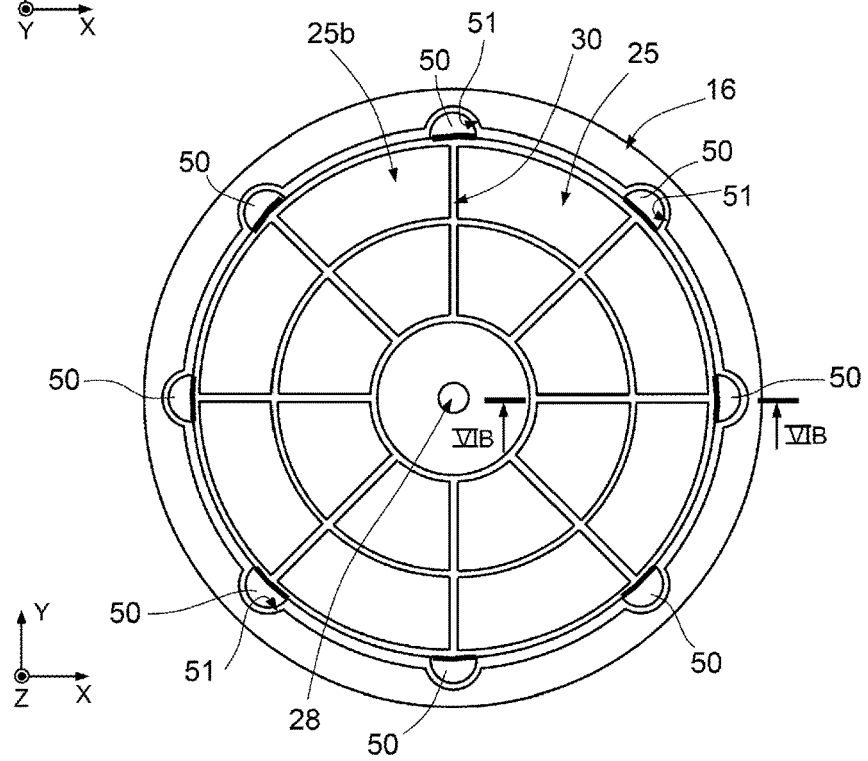
FIG. 6A is a view from beneath, with parts removed for greater clarity, of a MEMS acoustic transducer according to a further aspect of the present solution.
Figure 6B:
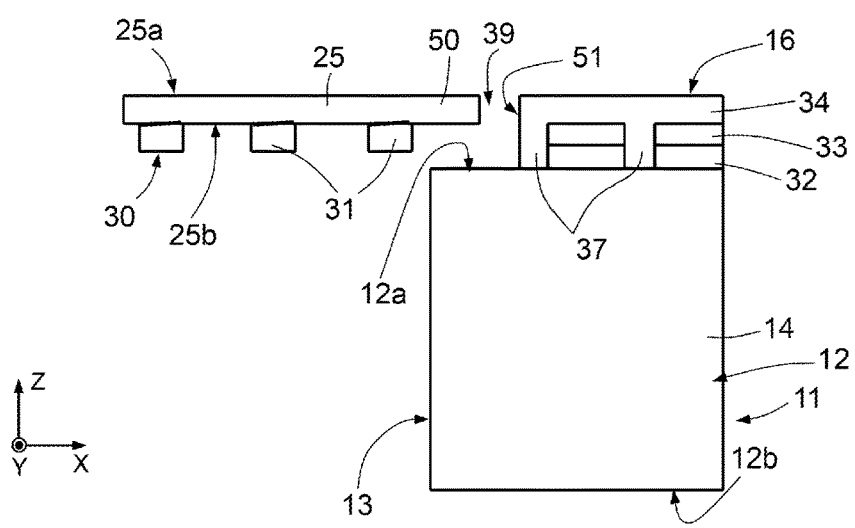
FIG. 6B is a cross-sectional view taken along the line of section VIB-VIB of a portion of the MEMS acoustic transducer of FIG. 6A.

According to a further aspect of the present solution, as illustrated schematically in FIGS. 6A and 6B, the passive membrane 25 comprises a number of stopper elements (or stoppers) 50, which are formed monolithically with the same passive membrane 25 and extend from a peripheral portion, or edge portion, of the passive membrane 25 towards the substrate 12, parallel to the horizontal plane xy. In the example illustrated, these stopper elements 50 are arranged in a way evenly distributed along the aforesaid peripheral portions of the passive membrane 25 (which has in this case, purely by way of example, a circular conformation in plan view, as the underlying through cavity 13). In particular, these stopper elements 50 face the front surface 12a of the substrate 12, suspended at a certain distance from the same substrate 12.

As shown in FIG. 6A, the anchorage structure 16, in particular the first structural region 34, defines a number of corresponding recesses 51, shaped and arranged so as to house the aforesaid stopper elements 50.

Advantageously, the stopper elements 50 limit the range of vertical movement of the passive membrane 25, along the vertical axis z in the direction towards the substrate 12, thus reducing the possibility of damage and failure, for example, in the case of impact or dropping of the electronic device in which the MEMS transducer 10 is incorporated. In particular, the range of movement of the passive membrane 25 in the direction of the substrate 12 is in fact limited by the aforesaid distance between the stopper elements 50 and the front surface 12a of the substrate 12.

It should be noted that, advantageously, the presence of the active membrane 15 above the passive membrane 25 moreover represents a further solution for stopping the movement of the passive membrane 25 along the vertical axis z, this time in a direction away from the substrate 12. In particular, the range of movement allowed in this direction corresponds to the facing distance between the passive and active membranes 25, 15, which is equal to the height of the pillar element 16.

The solution described therefore implements a two-directional stopper of the movement along the vertical axis z, therefore being mechanically robust and reliable.

Figure 7A:
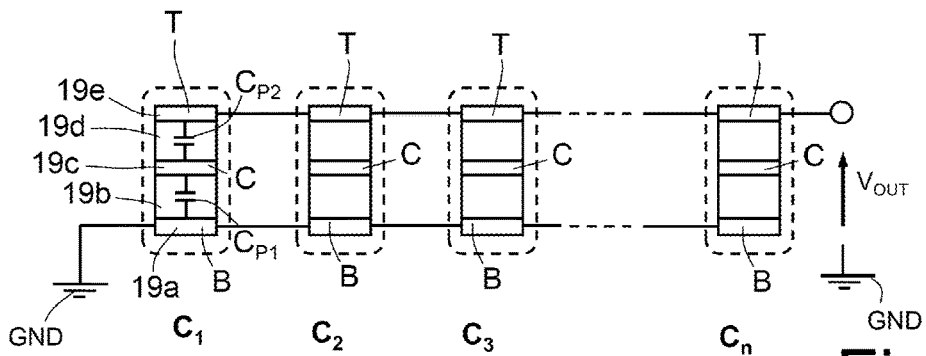
FIGS. 7A-7C show equivalent electrical diagrams of the connection between piezoelectric sensing elements of the MEMS acoustic transducer of FIG. 2 (for the case of bimorphic piezoelectric elements)
Figure 7B:
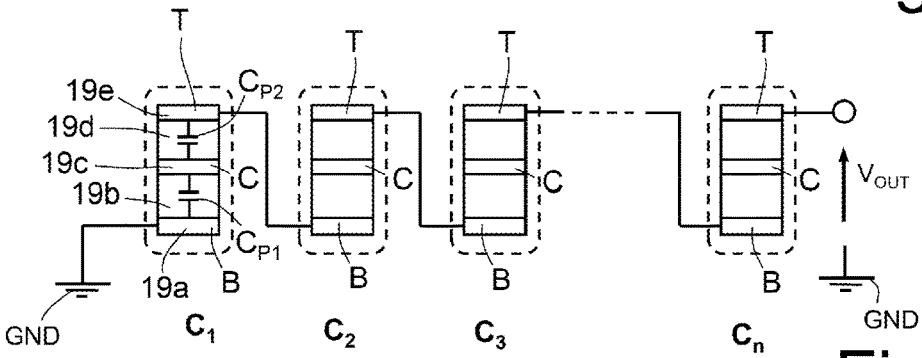
Figure 7C:
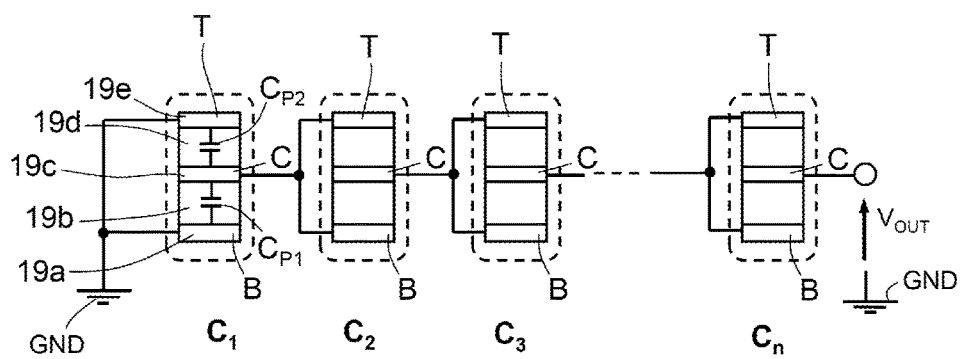

With reference to FIGS. 7A-7C, possible schemes of electrical connection between the electrodes of the sensing cells defined by the piezoelectric sensing elements 19 of the MEMS transducer 10 are now discussed in greater detail (in this case for the bimorphic implementation described previously).

The aforesaid FIGS. 7A-7C show a plurality of n sensing cells, here denoted by C1, C2, C3, ..., Cn, each comprising the stack formed by: the first electrode region 19a (which constitutes the bottom electrode, here denoted by B); the first region of piezoelectric material 19b; the second electrode region 19c (constituting the intermediate electrode, here denoted by C); the second region of piezoelectric material 19d; and the third electrode region 19e (constituting the top electrode, here denoted by T).

The first electrode region 19a, the first region of piezoelectric material 19b, and the second electrode region 19c of each sensing cell form a first capacitor, having a first capacitance Cp1 (as illustrated schematically just for the first sensing cell C1); likewise, the second electrode region 19c, the second region of piezoelectric material 19d, and the third electrode region 19e of each sensing cell form a second capacitor, having a second capacitance Cp2. For instance, the first and second capacitances Cp1, Cp2 are equal and the capacitances Cp1, Cp2 are the same in all the sensing cells.

In detail, in the connection diagram of FIG. 7C, the sensing cells are connected together according to a series-of-parallels configuration, where the first sensing cell C1 has the bottom electrode B and the top electrode T electrically coupled to a reference voltage (for example, ground GND) and the intermediate electrode C is electrically connected both to the bottom electrode B and to the top electrode T of the next sensing cell (here the second sensing cell C2). Likewise, the intermediate electrode C of the second sensing cell C2 is electrically coupled both to the bottom electrode B and to the top electrode T of the next sensing cell (the third sensing cell C3); this configuration is repeated for all the sensing cells up to the n-th sensing cell Cn; the intermediate electrode C supplies an output voltage Vout, which is the sum of the voltage drops on each of the sensing cells (the output voltage Vout being an electrical signal indicative of the acoustic pressure waves detected, generated jointly by the sensing cells).

Consequently, the aforesaid configuration is electrically equivalent to the series connection of the parallels between the first and the second capacitances Cp1, Cp2 of each sensing cell. Such a configuration can advantageously be used in applications where it is desired to achieve a best compromise between the resulting value of capacitance and the value of the output voltage Vout.

In the electrical diagram illustrated in FIG. 7B, the sensing cells are, instead, connected together according to a series-of-series configuration.

In this case, the first sensing cell C1 has the bottom electrode B electrically coupled to a reference voltage (ground GND) and the top electrode T electrically coupled to the bottom electrode B of the next sensing cell (here the second sensing cell C2). This configuration is repeated for all the sensing cells up to the n-th sensing cell Cn, the top electrode T of which supplies the output voltage Vout resulting from the voltage drops on each of the sensing cells.

Consequently, the above configuration is electrically equivalent to the series connection of the series of the first and the second electrical capacitances Cp1, Cp2 of each sensing cell. This configuration is advantageously used in applications where it is desirable to maximize the output voltage Vout and minimize the equivalent capacitance between the sensing cells C1, Cn, and therefore optimize the SNR.

In the electrical diagram illustrated in FIG. 7A, the sensing cells are, instead, connected together according to a parallel-of-series configuration.

In this case, the bottom electrodes B of all the sensing cells are electrically connected together; likewise, the top electrodes T of all the sensing cells are electrically connected together. Moreover, the first sensing cell C1 has the bottom electrode B electrically coupled to the reference voltage (ground GND) and the n-th sensing cell Cn has the top electrode T that supplies the output voltage Vout.

Consequently, the above configuration is electrically equivalent to connecting in parallel the series of the first and the second electrical capacitances Cp1, Cp2 of each sensing cell. This configuration may advantageously be used in applications where it is desirable to minimize the output voltage Vout (with a reduction of sensitivity and therefore a reduction of SNR).

It should be noted that the aforesaid electrical connections between the (top, bottom, and intermediate) electrodes of the various sensing cells defined by the piezoelectric sensing elements 19 are implemented (in a way that will be evident to a person skilled in the art, and for this reason is not described in detail herein) by appropriate electrical connection paths, which are provided on the active membrane 15, connecting the electrodes, and are electrically insulated from one another by appropriate passivation regions.

Figure 8:
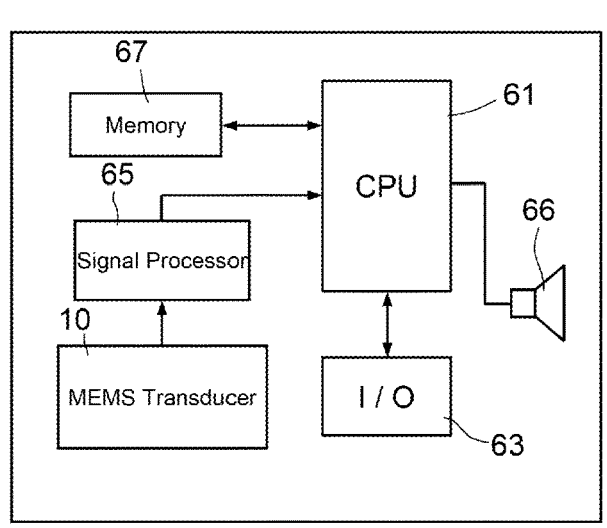
FIG. 8 shows a general block diagram of an electronic device comprising the MEMS acoustic transducer.

The MEMS transducer 10 described above may be used in an electronic device 60, as shown schematically in FIG. 8.

The electronic device 60 is, for example, a portable mobile-communication device, such as a smartphone, a PDA, a tablet, but also a voice recorder, a player of audio files with voice-recording capacity, etc. Alternatively, the electronic device 60 may be an acoustic apparatus, such as a set of headphones, a hydrophone capable of working underwater, or a hearing aid device.

The electronic device 60 comprises a microprocessor (CPU—Central Processing Unit) 61 and an input/output (I/O) unit 63, for example, provided with a keypad and a display, connected to the microprocessor 61. The MEMS transducer 10 communicates with the microprocessor 61 via a signal-processing block 65 (which can carry out further processing operations on the analog or digital signal at the output from the MEMS transducer 10). Moreover, the electronic device 60 may comprise a speaker 66, for generating sounds on an audio output (not shown), and an internal memory 67.

The advantages of the present solution are clear from the foregoing description.

In any case, it is underlined that the MEMS transducer 10 allows to achieve an optimal control of the low-frequency characteristics, in particular of the roll-off, thanks to the configuration of the ventilation hole, which is independent of the displacements and deformations of the mobile parts (in particular, independent of the movement of passive and active membranes 15, 25), given that it is in fact exclusively determined by the implemented manufacturing process (in particular, by photolithographic definition techniques).

The MEMS transducer 10 has a high sensitivity and a high signal-to-noise ratio SNR, in particular thanks to exploitation of the lever-arm effect generated by the movement of the passive membrane 25 (which is appropriately rigid and undeformable) and transmitted to the active membrane 15 carrying the piezoelectric sensing elements 19.

The MEMS transducer 10 is moreover advantageously protected from contamination, in effect being waterproof and dustproof, and from other kinds of contaminants, given that it is developed using piezoelectric technology. In particular, no holes accessible from outside are present that might allow penetration of particles or other contaminants in the gap present between the aforesaid passive and active membranes 25, 15.

The solution described is moreover compatible with the creation of two-directional stopper elements, i.e., ones acting in both directions of the vertical axis z, making it possible, in the case of impact or dropping, to effectively limit damage, in particular to the active membrane 15 and the passive membrane 25.

The manufacturing process is simple and economically advantageous to implement and is moreover compatible with the production of unimorphic or bimorphic piezoelectric stacks.

Finally, it is clear that modifications and variations may be made to what has been described and illustrated herein, without thereby departing from the scope of the present disclosure.

In particular, it is underlined that variants may be envisaged as regards the number, arrangement and conformation of the piezoelectric sensing elements 19, according to the desired electrical characteristics of detection (for example, in terms of sensitivity and signal-to-noise ratio, output voltage, and/or resulting capacitance) and the desired mechanical characteristics (for example, in terms of stiffness of the active membrane 15).

Figure 9:
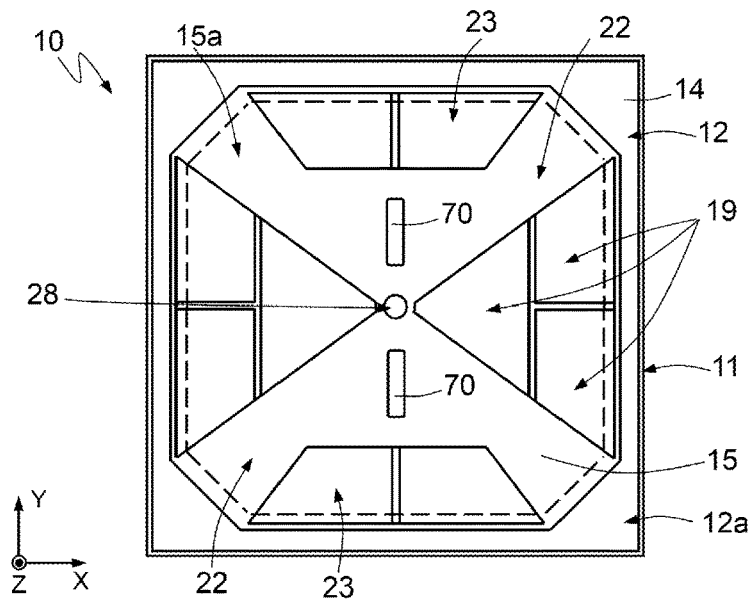
FIGS. 9-10 are top views, with parts removed for greater clarity, of further embodiments of the MEMS acoustic transducer.

For instance, as shown schematically in FIG. 9, one or more of the sensing elements 19 could be removed (with respect to the configuration described previously, for example, in FIG. 2), for instance, one or more of the sensing elements 19 that define the sensing cells at the vertex of the triangle occupied by the covered areas 23 of the active membrane 15 (i.e., by the regions overlaid by the aforesaid piezoelectric sensing elements 19). In the embodiment illustrated, instead of the aforesaid sensing elements 19 that have been removed, centrally-arranged reinforcement elements 70 are present, to prevent any undesirable deformation of the active membrane 15; these reinforcement elements 70 are constituted by regions of piezoelectric material (which are passive, i.e., not being electrically biased).

Figure 10:
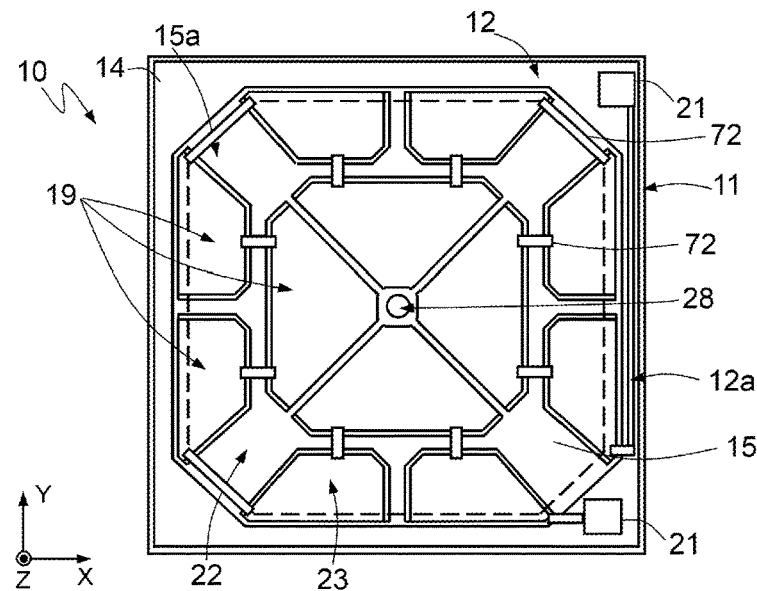

Alternatively, as shown in FIG. 10, a greater extension of the exposed areas 22 with respect to the covered areas 23 may be envisaged, a larger gap being present between the piezoelectric sensing elements 19 arranged at the base of the aforesaid triangle (at the peripheral portion of the active membrane 15) and the piezoelectric sensing elements 19 arranged at the vertex of the triangle (so as to obtain a desired balance between rejection of residual stresses of the piezoelectric stack and the overall stiffness of the membrane). In FIG. 10 possible electrical connections 72 between the piezoelectric sensing elements 19 and the contact pads 21 are schematically illustrated.

In general, it is evident that numerous further variant embodiments may be envisaged, which may differ as regards number and arrangements of the piezoelectric sensing cells; in any case, the arrangement of a certain number of piezoelectric sensing elements 19 at a position corresponding to the peripheral portion of the active membrane 15 is advantageous in so far as it is in this region that the greater stresses, due to the acoustic pressure waves, arise (as a consequence of the aforementioned lever-arm effect originated by the movement of the passive membrane 25 coupled to the active membrane 15).

Moreover, as discussed previously, it is once again emphasized that the sensing cells implemented by the piezoelectric sensing elements 19 may be of a unimorphic type, instead of a bimorphic type, in this case comprising only the first electrode region 19a (which constitutes the bottom electrode B) the first region of piezoelectric material 19b, arranged on the first electrode region 19a; and the second electrode region 19c (which in this case defines the top electrode T), arranged on the first region of piezoelectric material 19b.

Figure 11A:
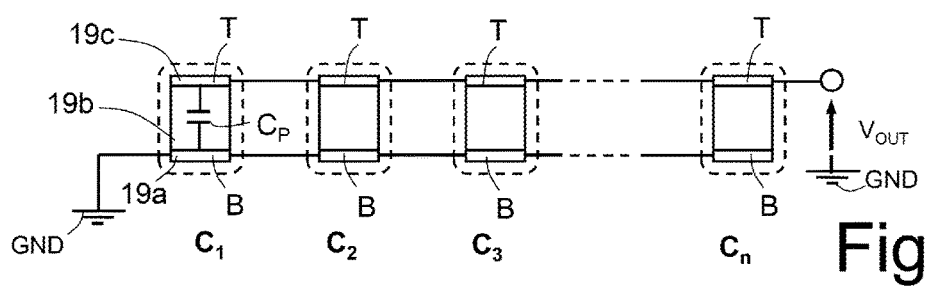
FIGS. 11A-11B show equivalent electrical diagrams of further variants of the connection between piezoelectric sensing elements of the MEMS acoustic transducer (for the case of unimorphic piezoelectric elements).
Figure 11B:
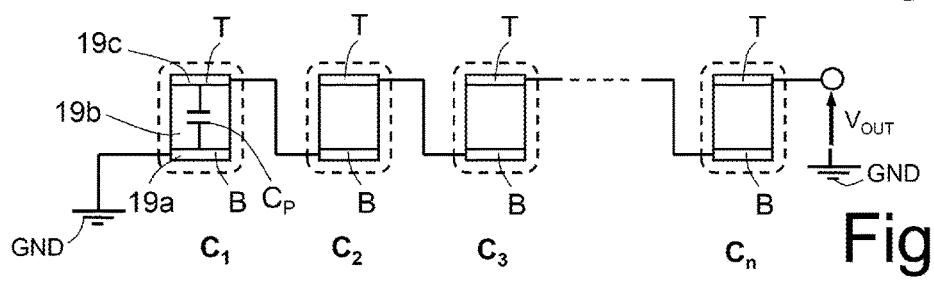

In this case, as shown in FIG. 11A and in FIG. 11B, respectively, the electrical-connection scheme implemented may be of a parallel type or of a series type.

In the first case (FIG. 11A), the bottom electrodes B of all the sensing cells are electrically connected together; likewise, the top electrodes T of all the sensing cells are electrically connected together. Moreover, the first sensing cell C1 has its bottom electrode B electrically coupled to the reference voltage (ground GND) and the n-th sensing cell Cn has the top electrode T that supplies the output voltage Vout. This configuration is electrically equivalent to connecting in parallel the electrical capacitances Cp of each of the sensing cells; this configuration is advantageously used in applications where a low output voltage Vout is desirable.

In the second case (FIG. 11B), the bottom electrode B of each sensing cell is electrically connected to the top electrode T of the previous sensing cell, with the exception of the bottom electrode B of the first cell C1 that is connected to the reference voltage (ground GND) and of the top electrode T of the last cell Cn that supplies the output voltage Vout. This configuration is electrically equivalent to connecting in series the electrical capacitances Cp of the sensing cells and is advantageous for achieving a best compromise between the resulting electrical capacitance and the output voltage Vout.

In a way not illustrated, the MEMS transducer 10 may moreover comprise an ASIC (Application-Specific Integrated Circuit), coupled to the sensing cells 19, which can be integrated in the body 11 of semiconductor material, or be constituted by a distinct die of semiconductor material.

In a way not illustrated, the MEMS transducer 10 may comprise an appropriate package, provided with an opening to enable entry of the acoustic waves to be detected.

Finally, it is underlined that the MEMS acoustic transducer 10 can operate for generation of acoustic waves, instead of for detection of acoustic waves; i.e., it may constitute a MEMS speaker (instead of a MEMS microphone).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric microelectromechanical acoustic transducer, comprising:
   a substrate of semiconductor material having a frame portion and a through cavity defined internally by said frame portion;
   an active membrane, suspended above the through cavity and having a peripheral portion;
   an anchorage structure anchoring the peripheral portion of the active membrane to the frame portion of the substrate;
   a plurality of piezoelectric sensing elements carried by a front surface of the active membrane and configured to detect mechanical stresses of said active membrane;
   a passive membrane suspended above the through cavity and underneath the active membrane, and interposed between the through cavity and a rear surface of said active membrane;
   a pillar element which fixedly couples, and is centrally interposed between, the active membrane and the passive membrane; and
   a ventilation hole passes entirely through the active membrane, the passive membrane and the pillar element so as to set the through cavity in fluidic communication with the front surface of said active membrane.

2. The transducer according to claim 1, wherein said substrate has a central axis, said pillar element is arranged at said central axis, said ventilation hole is traversed by said central axis, and said active membrane is anchored to the frame portion of the substrate by said anchorage structure throughout the entire peripheral portion of the active membrane.

3. The transducer according to claim 1, wherein:
   said substrate extends longitudinally in a horizontal plane;
   said passive membrane and said pillar element are configured to displace along a vertical axis, transverse to said horizontal plane, in response to incident acoustic pressure waves; and
   said ventilation hole has geometrical characteristics defined photolithographically and independent of the displacement of said passive membrane and of said pillar element.

4. The transducer according to claim 3, wherein said passive membrane has a reinforcement structure, formed integrally with said passive membrane and including a plurality of projecting portions which extend from a rear surface of the passive membrane and towards said through cavity.

5. The transducer according to claim 1, wherein a set of said piezoelectric sensing elements is arranged at said peripheral portion of said active membrane.

6. The transducer according to claim 1, wherein the front surface of said active membrane has covered areas overlaid by said piezoelectric sensing elements and exposed areas free from said piezoelectric sensing elements; wherein said covered areas and said exposed areas are sized according to characteristics of mechanical stiffness of said active membrane and moreover according to electrical characteristics of detection of said acoustic waves by said piezoelectric sensing elements.

7. The transducer according to claim 1, wherein said piezoelectric sensing elements each define a respective piezoelectric sensing cell, of a bimorphic or unimorphic type, and the piezoelectric sensing cells are electrically connected together so as to generate jointly an electrical-detection signal indicative of the acoustic pressure waves detected.

8. The transducer according to claim 1, wherein said piezoelectric sensing elements comprise a stack that includes:
a bottom electrode region, of conductive material, arranged on the front surface of said active membrane;
a top electrode region of conductive material; and
a region of piezoelectric material interposed between said bottom and top electrode regions.

9. The transducer according to claim 1, wherein said passive membrane comprises stopper elements which are formed monolithically with said passive membrane and extend towards the substrate, in a direction parallel to, and facing at a distance, a front surface of said substrate.

10. The transducer according to claim 1, wherein said anchorage structure is arranged at said frame portion of the substrate, and includes a stack of:
a first dielectric region arranged on a front surface of the substrate at the frame portion;
a second dielectric region arranged on the first dielectric region;
a first structural region, of conductive material, overlying the second dielectric region;
a third dielectric region overlying the first structural region;
a second structural region, of conductive material, overlying the third dielectric region; and
a plurality of first anchorage elements and second anchorage elements, said first anchorage elements extending through the first and the second dielectric regions between the substrate and the first structural region, and said second anchorage elements extending through the third dielectric region, between the first and the second structural regions; wherein:
said first structural region has a same thickness as said passive membrane and is arranged at a same level above the front surface of the substrate as said passive membrane;
said third dielectric region defines a distance between the passive membrane and the active membrane and a height of said pillar element; and
said second structural region has a same thickness as said active membrane and is set at a same level above the front surface of the substrate as said active membrane.

11. An electronic device, comprising:
a piezoelectric microelectromechanical acoustic transducer that includes:
a substrate of semiconductor material having a frame portion and a through cavity defined internally by said frame portion;
an active membrane, suspended above the through cavity and having a peripheral portion;
an anchorage structure anchoring the peripheral portion of the active membrane to the frame portion of the substrate;
a plurality of piezoelectric sensing elements carried by a front surface of the active membrane and configured to detect mechanical stresses of said active membrane;
a passive membrane suspended above the through cavity and underneath the active membrane, and interposed between the through cavity and a rear surface of said active membrane;
a pillar element which fixedly couples, and is centrally interposed between, the active membrane and the passive membrane; and
a ventilation hole passes entirely through the active membrane, the passive membrane and the pillar element so as to set the through cavity in fluidic communication with the front surface of said active membrane;
a signal-processing stage coupled to the acoustic transducer; and
a processing unit coupled to the signal-processing block.

12. The electronic device according to claim 11, wherein said substrate has a central axis, said pillar element is arranged at said central axis, said ventilation hole is traversed by said central axis, and said active membrane is anchored to the frame portion of the substrate by said anchorage structure throughout the entire peripheral portion of the active membrane.

13. The electronic device according to claim 11, wherein said passive membrane comprises stopper elements which are formed monolithically with said passive membrane and extend towards the substrate, in a direction parallel to, and facing at a distance, a front surface of said substrate.

14. A process for manufacturing a piezoelectric microelectromechanical acoustic transducer, comprising:
forming an active membrane, above a substrate of semiconductor material and anchored to a frame portion of said substrate by an anchorage structure at a peripheral portion of the active membrane;
forming a plurality of piezoelectric sensing elements on a front surface of the active membrane, the piezoelectric sensing elements being configured to detect mechanical stresses of said active membrane;
forming a passive membrane underneath the active membrane and interposed between said substrate and a rear surface of said active membrane;
forming a pillar element, which fixedly couples, and is centrally interposed between, the active membrane and the passive membrane; and
forming a ventilation hole that passes entirely through the active membrane, the passive membrane, and the pillar element.

15. The process according to claim 14, wherein forming the passive membrane comprises:
forming a first sacrificial layer of dielectric material on a front surface of said substrate;
forming first anchorage openings through an entire thickness of said first sacrificial layer;

forming first reinforcement-definition openings in a surface portion of said first sacrificial layer internally with respect to said first anchorage openings;

forming a first membrane layer, of conductive material, on the first sacrificial layer, the first membrane layer filling the first anchorage openings to form first anchorage elements and filling the first reinforcement-definition openings to form reinforcement elements; and defining said first membrane layer to form said passive membrane and, at the same time, a reinforcement structure fixed with respect to said passive membrane and constituted by said reinforcement elements.

16. The process according to claim 15, wherein forming said active membrane comprises:

forming a second sacrificial layer of dielectric material on said first membrane layer;

forming, through an entire thickness of said second sacrificial layer, second anchorage openings in positions vertically corresponding to said first anchorage elements and a pillar opening in a central portion of said second sacrificial layer;

forming a second membrane layer, of conductive material, on the second sacrificial layer, the second membrane layer filling the second anchorage openings to form second anchorage elements and filling the pillar opening; and defining said second membrane layer to form said active membrane and, at the same time, said pillar element fixed to said active membrane.

17. The process according to claim 16, wherein forming said ventilation hole comprises forming a through hole through entire thicknesses of said active membrane, of said pillar element, and of the passive membrane.

18. The process according to claim 16, further comprising:

selectively removing a portion of the substrate so as to form a through cavity inside said frame portion; and carrying out an etching step so as to remove portions of the first sacrificial layer facing said through cavity and remove portions of the second sacrificial layer interposed between the passive membrane and the active membrane so as to obtain release of the passive membrane and of the active membrane, which are suspended above the through cavity.

19. The process according to claim 14, further comprising forming stopper elements, monolithic with said passive membrane, which extend from a peripheral portion of the passive membrane towards the substrate, parallel to, and facing at a distance, the front surface of said substrate.

20. The process according to claim 14, wherein forming said piezoelectric sensing elements comprises forming a stack of:

a bottom electrode region, of conductive material, arranged on the front surface of said active membrane;

a top electrode region; and a region of piezoelectric material interposed between said bottom and top electrode regions.

\* \* \* \* \*